United States Patent [19]

Sigmon

[11] Patent Number: 5,063,360

[45] Date of Patent: Nov. 5, 1991

[54] PULSE REPETITION FREQUENCY PUSHING COMPENSATION CIRCUIT

[75] Inventor: Bernard E. Sigmon, Tempe, Ariz.

[73] Assignee: Motorola, Inc., Schaumburg, Ill.

[21] Appl. No.: 663,505

[22] Filed: Mar. 4, 1991

[51] Int. Cl.[5] .......................... H03B 5/04; H03B 5/18; H03B 7/12; H03L 1/02

[52] U.S. Cl. ........................................ 331/175; 331/99; 331/173; 331/176; 331/177 V

[58] Field of Search ...................... 331/66, 96, 99, 100, 331/107 DP, 107 P, 107 SL, 117 D, 173, 174, 175, 176, 177 V

[56] References Cited

U.S. PATENT DOCUMENTS 4,843,347 6/1989 Sigmon et al. ..................... 331/88

Primary Examiner—David Mis
Attorney, Agent, or Firm—Frank J. Bogacz

[57] ABSTRACT

A pulse repetition frequency (PRF) pushing compensation circuit to negate PRF-induced frequency shifts and ambient temperature change-induced frequency shifts in pulsed RF sources. The PRF pushing compensation circuit samples PRF voltage and feeds it into a resistor-capacitor (RC) network so that the DC voltage component across the capacitor is directly proportional to the PRF. The DC voltage is then amplified, via a transistor, and fed to a varactor diode circuit coupled to the source's frequency determining element (e.g., dielectric resonator, microwave cavity, or other element). With a varactor diode tuning the source, the capacitor voltage derived from the PRF voltage is applied to the varactor diode to effect a frequency shift in the pulsed RF source which is equal and off-setting to the PRF-induced frequency shift. Temperature sensitive resistors can be used in the DC offset voltage of the varactor diode circuit to compensate for frequency changes due to ambient temperature variances.

20 Claims, 1 Drawing Sheet

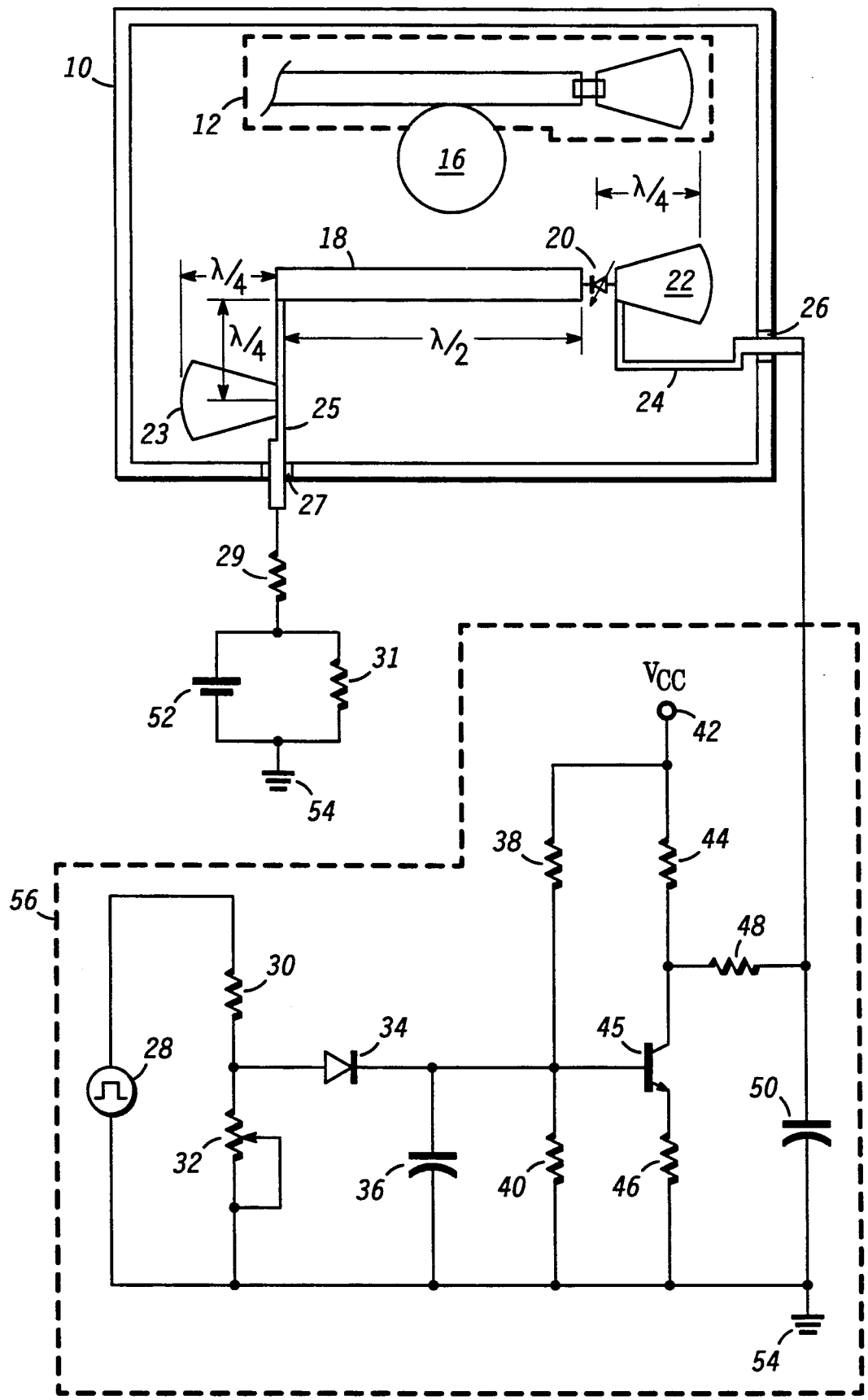

PULSE REPETITION FREQUENCY PUSHING COMPENSATION CIRCUIT

CROSS-REFERENCES TO RELATED APPLICATIONS

This invention relates to co-pending U.S. Patent application Ser. No. 532,425 now U.S. Pat. No. 5,027,086 from the same inventive entity, having the same assignee.

BACKGROUND OF THE INVENTION

This invention relates in general to the field of pulsed sources and in particular to frequency pushing stabilization of sources.

Most pulsed sources, including vacuum tube as well as solid-state, will shift in frequency due to changes in power dissipation within the source. These frequency shifts are essentially due to thermal heating which increases as the pulsed source duty cycle is changed and the pulse repetition frequency (PRF) increases. As an example, for an X-band oscillator (10 GigaHertz (GHz)), a typical uncompensated PRF-induced frequency shift can be 4.2 MegaHertz (MHz) for a variation from 0 to 7 kiloHertz (kHz) PRF. This thermal frequency drift may not always be tolerable in the situation of stringent frequency stability requirements.

Typical methods for dealing with frequency stabilization involve the techniques of injection locking, multiplier chains, or phase locked loops. However, these techniques are relatively complex (i.e., require a significant number of component parts), and are relatively large and costly. These classical approaches also typically use Watts (W) of direct current (DC) power, which may be several orders of magnitude beyond what is available for frequency stabilization of a given circuit. Relatively high power consumption and high part count can also substantially lessen overall reliability. Where battery operated systems are used, a large DC power requirement is prohibitive. It is especially difficult to provide for frequency stability in pulsed sources where low cost and small size are significant constraints.

Thus, a practical, economical method for the frequency stabilization of pulsed sources, employing an apparatus which contains relatively few parts, is small, simple to implement and adjust, and which consumes little DC power would be particularly advantageous. It would additionally advantageous to provide for the frequency stabilization method to allow for temperature controlling of components to compensate frequency changes due to ambient temperature changes.

SUMMARY OF THE INVENTION

Accordingly, it is an advantage of the present invention to provide a new and improved method for the stabilization of frequency in pulsed sources. It is a further advantage of the present invention to provide for the frequency stabilization in a device which employs few parts, is small, is relatively simple to make and adjust, and which consumes little DC power. It is still a further advantage of the present invention to allow for temperature controlling of components to compensate frequency changes due to ambient temperature changes.

To achieve these advantages, a PRF pushing compensation circuit is contemplated for pulsed sources which samples source PRF voltage and feeds it into a resistor-capacitor (RC) network so that the DC voltage component across the capacitor is directly proportional to the PRF. The DC voltage is then amplified, via a transistor, and fed to a varactor diode coupled to the source's frequency determining element (dielectric resonator, microwave cavity, or other element). With a varactor diode able to electrically tune the source, at a minimum, an amount equal to the PRF-induced frequency shifts, the amplified capacitor voltage derived from the PRF voltage is applied to the varactor in such a manner as to effect an equal and off-setting frequency shift to negate the PRF-induced frequency shifts. By additionally employing temperature sensitive resistors (e.g., thermistors or sensistors) to control the amplitude of the correction voltage with ambient temperature changes, frequency changes due to ambient temperature variances can also be compensated.

The above and other features and advantages of the present invention will be better understood from the following detailed description taken in conjunction with the accompanying drawings.

BRIEF DESCRIPTION OF THE DRAWING

In the single sheet of drawings, there is shown a circuit schematic of the preferred embodiment of the invention.

DETAILED DESCRIPTION OF THE PREFERRED EMBODIMENT

In the single sheet of drawings, there is shown a circuit schematic of a PRF pushing compensation circuit. Pulsed source circuit 10 employs a Gunn diode combiner/dielectric resonator oscillator. The first side 12 of the pulsed source circuit 10 is electromagnetically coupled to source frequency-determining element 16, which in the preferred embodiment is a dielectric resonator. Electromagnetically coupled to the source frequency-determining element 16 opposite the first side 12 of the pulsed source circuit 10 is one-half wavelength line 18, connected at one end to varactor diode 20. Varactor diode 20 is connected to a one-quarter wavelength line element 22, which is coupled to amplifier-to-source connection 24. Amplifier-to-source connection 24 exits the pulsed source circuit 10 via hole 26 and then connects to the pulse bias amplifier circuit 56.

The second end of one-half wavelength line 18 is coupled to the varactor diode-to-bias connection 25. Varactor diode-to-bias connection 25 is also coupled to one-quarter wavelength line element 23 and exits the pulsed source circuit 10 via hole 27 before connecting through optional temperature-sensitive resistor 29 to electrical ground 54 through varactor diode bias voltage 52. Also, between optional temperature-sensitive resistor 29 and varactor diode bias voltage 52, is connected one end of optional temperature-sensitive resistor 31. The other end of optional temperature-sensitive resistor 31 is connected to electrical ground 54.

Pulse bias amplifier circuit 56 includes pulse bias 28, which provides the PRF for the source circuit 10. Pulse bias 28 is coupled to resistor 30 and variable resistor 32 of resistances 2 kilo-ohms (2 k$\Omega$) and 10 k$\Omega$, respectively, in the preferred embodiment. Resistor 30 and variable resistor 32 comprise a voltage divider. The anode of diode 34 is connected between the common connection of resistor 30 and variable resistor 32 and the cathod of diode 34 is connected to capacitor 36 of capacitance 0.1 micro-Farads ($\mu$F) and resistors 38 and 40, of respective resistances 68 k$\Omega$ and 13 k$\Omega$. Resistors 38 and 40, along with collector resistor 44, emitter resistor 46 and transistor 45 form a common emitter transistor amplifier in the preferred embodiment.

In the common emitter transistor amplifier, collector voltage $V_{cc}$ 42 is impressed across resistor 38 to the transistor 45 base and through collector resistor 44 to the collector of transistor 45. The base of transistor 45 is connected through resistor 40 to electrical ground 54 and the emitter of transistor 45 is connected through resistor 46 to electrical ground 54 as well. The collector of transistor 45 is connected through a low pass filter consisting of resistor 48 and capacitor 50 to electrical ground 54, with output taken between resistor 48 and capacitor 50 and connected via hole 26 and amplifier-to-source connection 24 to varactor diode 20.

The gain must be set for the compensation circuit, and component values chosen to provide compensation due to changes in the PRF of the pulsed source. To make these choices, an accurate characterization of the frequency shift of the pulsed source due to changes in the PRF must be made. As an example, for the pulsed source of the Gunn diode combiner/dielectric resonator oscillator, the source's frequency shifted downward in frequency with slightly increasing negative slope as the PRF of the source changes from a low PRF of 80 Hz to a high PRF of 8,000 Hz. Overall, the frequency shifts approximately 5 MHz over the range of PRFs.

The second characterization to be performed is that of the effect of the varactor tuning circuit on the solid-state source (at a fixed PRF). The varactor diode 20 is reverse biased and the upward changes in frequency as the varactor diode bias voltage 52 is changed need to be characterized over a frequency range at least as large as the PRF-induced frequency shift to be negated. For the varactor diode 20 in the preferred embodiment, approximately 6.8 MHz of upward frequency shift results when biasing the varactor diode 20 from 0 to 15 Volts (V) of varactor diode bias voltage 52. The frequency shift versus varactor diode tuning voltage plot is a curve of decreasing positive slope for higher varactor diode tuning voltages.

In operation, the circuit functions to counteract PRF-induced frequency shifts and ambient temperature change-induced frequency shifts of the pulsed source circuit 10. As the PRF of the pulsed source circuit 10 is changed, thermally-induced changes in the pulsed source cause frequency shifts in the PRF. The pulse bias 28 for the pulsed source circuit 10 PRF is sampled, and the voltage is divided by resistor 30 and variable resistor 32 to an appropriate value for processing in the compensation circuit. The divided pulse bias signal is fed through diode 34. The diode 34 prevents discharge of capacitor 36 through the resistor 30 or variable resistor 32 in the network. The DC voltage across the capacitor 36 of the RC network is thus directly proportional to the pulse bias 28 and thus the PRF. The DC voltage across capacitor 36 is then amplified and fed to a varactor diode 20 coupled to the source's frequency determining element 16 (a dielectric resonator in the preferred embodiment). The voltage across varactor diode 20 increases in proportion to the increased pulse bias 28 voltage, changing the impedance within the pulsed source circuit 10 and providing upward frequency shifts in the source which are equal and opposite the PRF-induced frequency shifts.

If optional temperature-sensitive resistors 29 and 31 are used (e.g., thermistors or sensistors) in the varactor diode bias circuit and chosen with values to control the amplitude of the correction voltage with ambient temperature changes, frequency changes due to ambient temperature variances can similarly be negated.

Thus, a pulse repetition frequency pushing compensation circuit has been described which overcomes specific problems and accomplishes certain advantages relative to prior art methods and mechanisms. The improvements over known technology are significant. All previous active device schemes to reduce frequency variations caused by temperature, PRF, or other thermal variations have employed techniques such as phase-lock loops, multiplier chains, or injection locking methods to achieve a relatively stable source. All of these methods, however, result in relatively large devices, are difficult to implement, consume relatively large amounts of DC power (which becomes prohibitive in battery-operated systems), and, due to their complexity, reduce the mean time between failure of the system. The PRF pushing compensation circuit uses several orders of magnitude less DC power than the more traditional approaches. In addition, while active device methods are also relatively expensive, the cost of implementing frequency compensation for PRF-induced frequency shifts may be reduced from the order of $2,000 to $3,000 per unit with the more traditional approaches to the order of $100 per unit with the PRF pushing compensation circuit.

Thus, there has also been provided, in accordance with an embodiment of the invention, a pulse repetition frequency pushing compensation circuit that fully satisfies the aims and advantages set forth above. While the invention has been described in conjunction with a specific embodiment, many alternatives, modifications, and variations will be apparent to those of ordinary skill in the art in light of the foregoing description. Accordingly, the invention is intended to embrace all such alternatives, modifications, and variations as fall within the spirit and broad scope of the appended claims.

I claim:

1. A frequency-pushing compensation circuit for a pulsed source with a pulse repetition frequency (PRF)-induced frequency shift, comprising:

pulsed source means;

frequency compensation means coupled to the pulsed source means; and pulse bias amplification means coupled separately to the pulsed source means and to the frequency compensation means, the pulse bias amplification means producing a feedback compensation signal to the frequency compensation means to reduce the PRF-induced frequency shift.

2. A frequency-pushing compensation circuit as claimed in claim 1, wherein the pulsed source means comprises pulse bias means coupled to the pulse bias amplification means.

3. A frequency-pushing compensation circuit as claimed in claim 2, wherein the frequency compensation means comprises a varactor diode circuit means coupled to the pulsed source means which tunes the frequency of the pulsed source means.

4. A frequency-pushing compensation circuit as claimed in claim 3, wherein the pulse bias amplification means comprises:

an input coupled to the pulsed source means;

voltage divider means coupled to the input from the pulsed source means and to electrical ground;

a diode coupled to the voltage divider means, the diode forward biased away from the voltage divider means;

capacitor means coupled to the diode and to electrical ground;

amplifier means with an input coupled to the diode side of the capacitor means and to an output coupled to the frequency compensation means.

5. A frequency-pushing compensation circuit as claimed in claim 4, wherein the amplifier means comprises a single transistor common emitter amplifier.

6. A frequency-pushing compensation circuit as claimed in claim 5 which further comprises filter means coupled between the output of the amplifier means and the frequency compensation means.

7. A frequency-pushing compensation circuit as claimed in claim 6, wherein the varactor diode circuit means compensates pulsed source frequency changes due to ambient temperature changes, the varactor diode means comprises:

a varactor diode coupled to the pulsed source means;

a first thermistor coupled to the varactor diode;

a DC offset voltage source coupled between the first thermistor and electrical ground; and a second thermistor coupled between the common connection of the first thermistor and the DC offset voltage source and electrical ground.

8. A frequency-pushing compensation circuit as claimed in claim 6, wherein the varactor diode circuit means compensates pulsed source frequency changes due to ambient temperature changes, the varactor diode means comprises:

a varactor diode coupled to the pulsed source means;

a first sensistor coupled to the varactor diode;

a DC offset voltage source coupled between the first thermistor and electrical ground; and a second sensistor coupled between the common connection of the first thermistor and the DC offset voltage source and electrical ground.

9. A frequency-pushing compensation circuit as claimed in claim 7, wherein the amplifier means further comprises at least one temperature sensitive resistor to compensate the amplification of the transistor for ambient temperature changes.

10. A method of frequency compensating a pulsed source with pulse repetition frequency (PRF)-induced frequency shift comprising the steps of:

sampling a pulse bias voltage of the pulsed source;

feeding the pulse bias voltage through an RC network;

amplifying a DC voltage across the capacitor of the RC network;

feeding the amplified DC voltage to a source frequency determining element; and tuning the pulsed source in frequency to compensate the PRF-induced frequency shift.

11. A method of frequency compensating a pulsed source with pulse repetition frequency (PRF)-induced frequency shift as claimed in claim 10, wherein the step of feeding the pulse bias voltage through an RC network comprises the steps of:

dividing the pulse bias voltage; and feeding the voltage-divided pulse bias voltage though a forward-biased diode to prevent discharge of the DC voltage through the voltage divider.

12. A method of frequency compensating a pulsed source with pulse repetition frequency (PRF)-induced frequency shift as claimed in claim 11 which further comprises the step of compensating for ambient temperature changes using temperature-sensitive resistors.

13. A frequency stabilizer coupled to a variable pulsed source, the frequency stabilizer comprising:

pulse controlling means coupled to the variable pulsed source;

sampling means coupled to the pulse controlling means to produce a signal proportional to a pulse controlling signal;

amplification means coupled to the sampling means to amplify the signal proportional to the pulse controlling signal; and tuning means coupled to the amplification means and the variable pulsed source which adjusts the variable pulsed source frequency to compensate for pulse-repetition frequency (PRF)-induced frequency shifts in the variable pulsed source.

14. A frequency stabilizer for a variable pulsed source as claimed in claim 13, wherein the pulse controlling means comprises a pulse bias means coupled to the sampling means.

15. A frequency stabilizer for a variable pulsed source as claimed in claim 14, wherein the sampling means comprises:

an input from the pulse controlling means;

voltage reducing means coupled to the input from the pulse controlling means; and storage means coupled to the voltage reducing means to maintain a sample of the pulse bias means.

16. A frequency stabilizer for a variable pulsed source as claimed in claim 15, wherein the amplification means comprises:

an amplifier input coupled to the storage means;

an amplifier coupled to the amplifier input for amplifying the input from the pulse controlling means;

an amploifier output coupled to the amplifier; and filter means coupled to the amplifier output and to the tuning means.

17. A frequency stabilizer for a variable pulsed source as claimed in claim 16, wherein the tuning means includes a varactor diode circuit means coupled to the filter means and to the variable pulsed source.

18. A frequency stabilizer for a variable pulsed source as claimed in claim 17, wherein the varactor diode circuit means compensates pulsed source frequency changes due to ambient temperature changes, the varactor diode circuit means comprises:

a varactor diode coupled to the variable pulsed source;

a first thermistor coupled to the varactor diode;

a DC offset voltage source coupled between the first thermistor and electrical ground; and a second thermistor coupled between the common connection of the first thermistor and the DC offset voltage source and electrical ground.

19. A frequency-pushing compensation circuit as claimed in claim 16, wherein the varactor diode circuit means compensates pulsed source frequency changes due to ambient temperature changes, the varactor diode circuit means comprises:

a varactor diode coupled to the variable pulsed source;

a first sensistor coupled to the varactor diode;

a DC offset voltage source coupled between the first thermistor and electrical ground; and a second sensistor coupled between the common connection of the first thermistor and the DC offset voltage source and electrical ground.

20. A frequency-pushing compensation circuit as claimed in claim 18, wherein the amplifier includes at least one temperature sensitive resistor to compensate the amplification of the transistor for ambient temperature changes.

* * * * *